United States Patent [19]

Wright

[11] Patent Number: 5,051,621
[45] Date of Patent: Sep. 24, 1991

[54] AREA-EFFICIENT LOW-POWER BIPOLAR CURRENT-MODE LOGIC

[75] Inventor: Michael E. Wright, Berkeley, Calif.

[73] Assignee: National Semiconductor Corporation, Santa Clara, Calif.

[21] Appl. No.: 519,385

[22] Filed: May 4, 1990

[51] Int. Cl.⁵ ................ H03K 19/086; H03K 19/082; H03K 19/013; H03K 19/003
[52] U.S. Cl. .............................. 307/455; 307/299.3; 307/454; 307/475; 307/482.1
[58] Field of Search ............... 307/475, 455, 456, 446, 307/443, 270, 355, 358, 457, 272.1, 272.2, 303, 482.1, 299.3

[56] References Cited

U.S. PATENT DOCUMENTS

| 4,704,544 | 11/1987 | Horwitz | 307/454 X |
| 4,736,125 | 4/1988 | Yuen | 307/475 |
| 4,737,663 | 4/1988 | Varadarajan | 307/455 |
| 4,945,263 | 7/1990 | Estrada | 307/455 X |
| 4,945,265 | 7/1990 | Estrada | 307/455 |
| 4,988,898 | 1/1991 | Jansson | 307/456 X |
| 4,988,899 | 1/1991 | Jansson | 307/456 X |

Primary Examiner—Stanley D. Miller
Assistant Examiner—David R. Bertelson
Attorney, Agent, or Firm—Gail W. Woodward; Michael A. Glenn; James W. Rose

[57] ABSTRACT

Current mode logic configuration circuits are shown for use with linear integrated circuit chips. The circuits employ plural collector lateral transistors to provide logic current source outputs in response to logic current inputs that are accepted by NPN transistor current mirrors acting as current sinks. Conventional logic functions are detailed and a toggle flip-flop configuration is shown being composed of the basic logic gates. Since the disclosed current mode voltage swings are small the circuit speed is relatively high at a given shunt capacitance. Die surface area is low with many transistors sharing common n-epitaxial tubs.

9 Claims, 3 Drawing Sheets

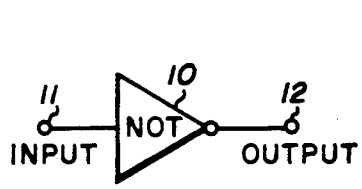
Fig_1A
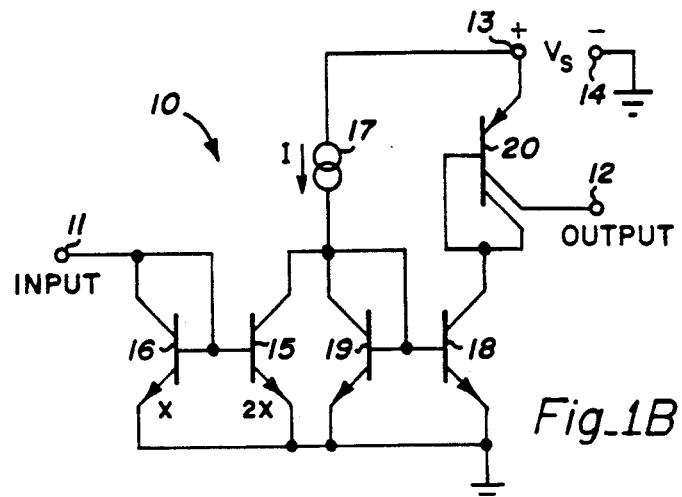
Fig_1B
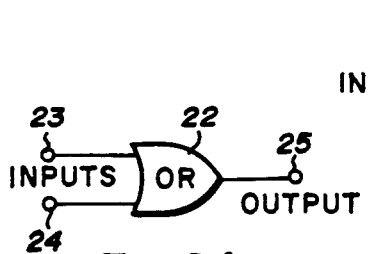
Fig_2A
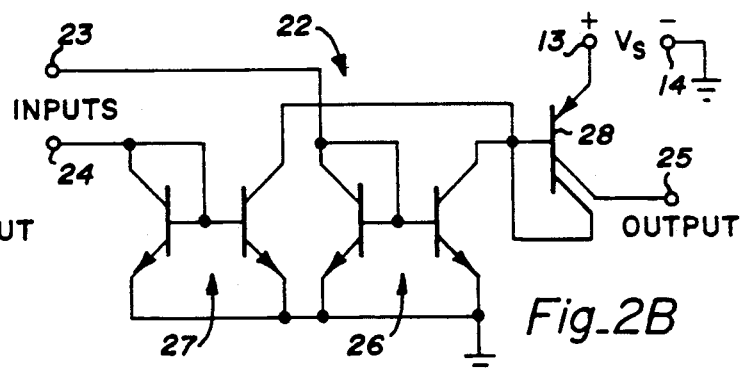
Fig_2B
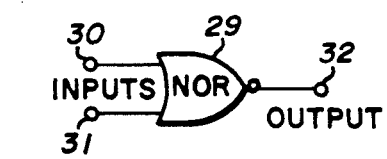
Fig_3A
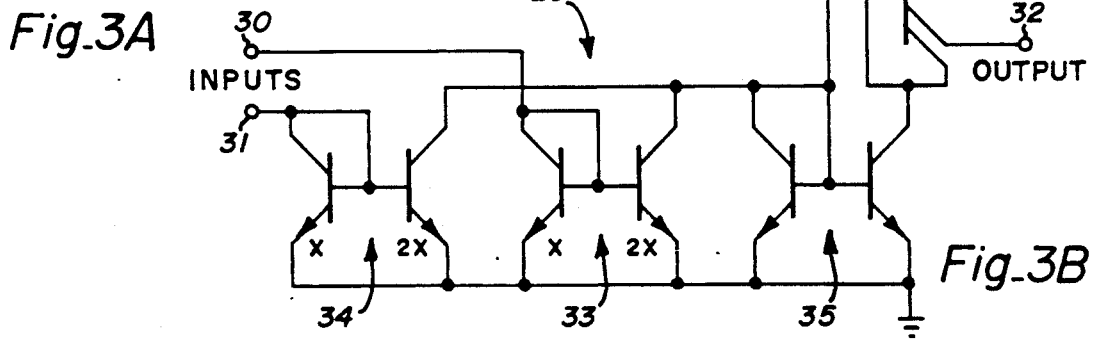
Fig_3B
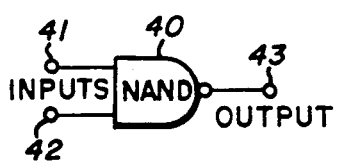
Fig_4A
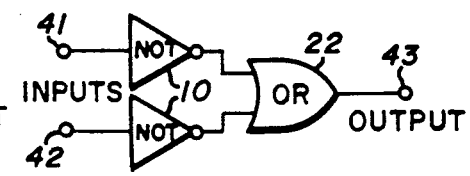
Fig_4B
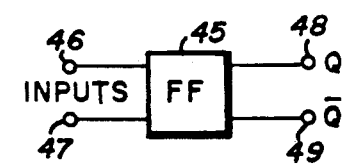
Fig_5A

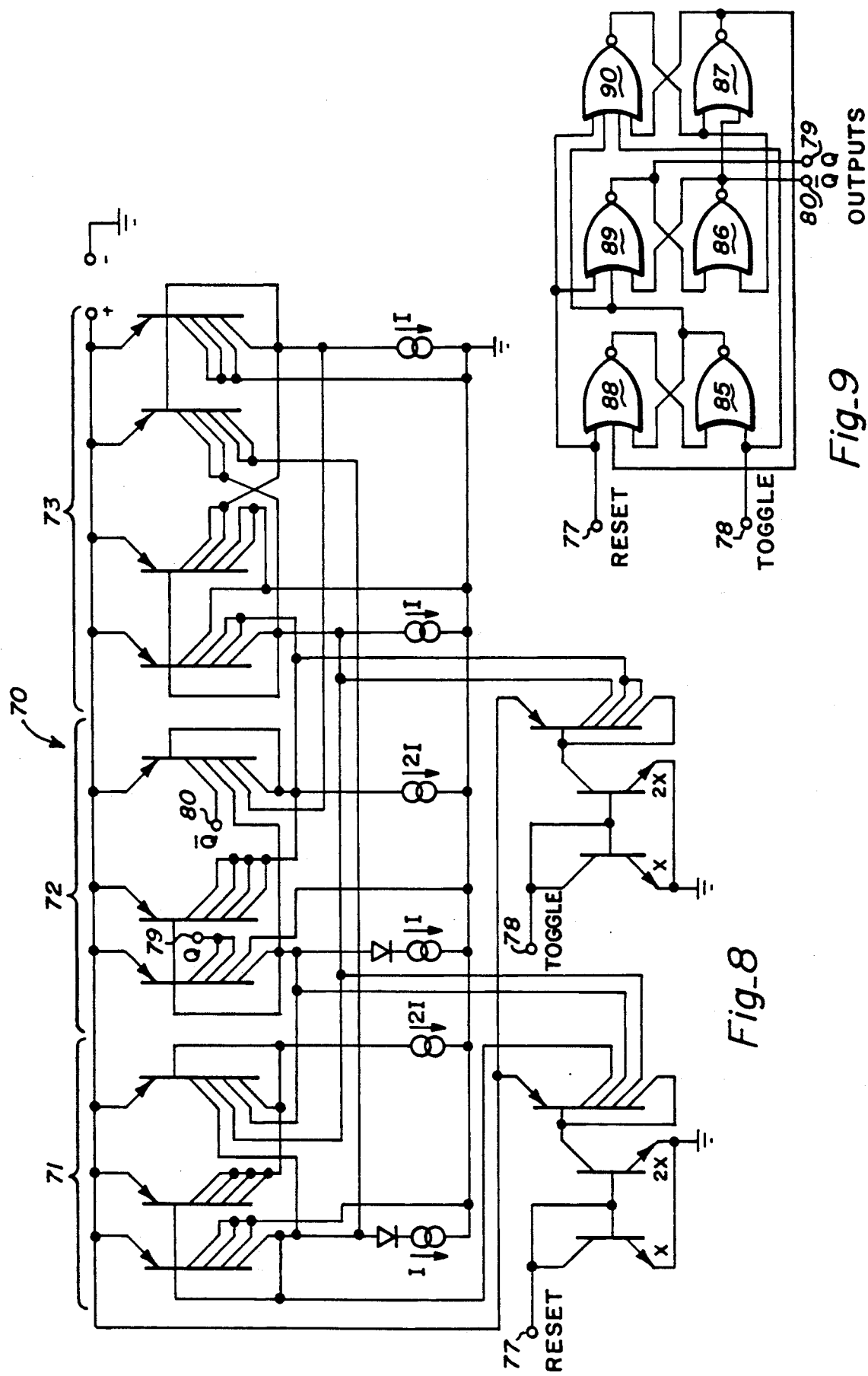

AREA-EFFICIENT LOW-POWER BIPOLAR CURRENT-MODE LOGIC

BACKGROUND OF THE INVENTION

Bipolar transistor logic is ordinarily inplemented using well-known Schottky circuits to avoid transistor saturation, particularly where low power is to be employed. This class of circuit is typically in the form of transistor-transistor logic (TTL). A well-known product line is the FAST® integrated circuits. This is the Fairchild Advanced Schottky TTL logic family which is a registered trademark of National Semiconductor Corporation. Where higher power dissipation can be tolerated the wellknown emitter coupled logic (ECL) is commonly employed for high speed operation. These logic design families require special processing to create and must be specifically designed and fabricated.

By employing bipolar transistors in the current mode a number of advantages can be realized. First, the logic functions can be incorporated into area efficient designs. The current mode operation produces relatively high speed operation because the circuit nodes operate with greatly reduced voltage swings and the shunt capacitances do not have to be fully charged and discharged as is the case with voltage mode circuits. Finally, the circuits employ conventional bipolar transistors of the kind ordinarily employed in the well-known linear silicon, bipolar, junction-isolated, monolithic, integrated circuits. Thus, linear and digital circuits can easily be combined in low-cost, high-yield device structures.

SUMMARY OF THE INVENTION

It is an object of the invention to provide digital logic circuits composed of conventional transistors of the kind employed in linear monolithic integrated circuits.

It is a further object of the invention to fabricate digital circuits within and part of an integrated circuit using linear monolithic construction and employing conventional transistors and fabrication techniques.

These and other objects are achieved as follows. Conventional logic function circuits such as NOT, OR and NOR are created using plural collector lateral PNP transistors and vertical NPN transistors. The circuits employ current mode and thus produce the logic transitions that do not require the node capacitances to be fully charged and discharged. The basic circuits are combined to produce a S-R flip-flop and a toggle flip-flop. Additionally, a method for temperature compensating the set and reset currents is detailed.

BRIEF DESCRIPTION OF THE DRAWING

FIG. 1A is the symbol for a NOT gate and FIG. 1B is a schematic diagram of a NOT gate circuit.

FIG. 2A is the symbol for an OR gate and FIG. B is a schematic diagram of an OR gate circuit.

FIG. 3A is the logic symbol for a NOR gate. This function is produced in the schematic circuit of FIG. 3B.

FIG. 4A is the symbol for a NAND gate and FIG. 4B is a NAND gate function created by combining an OR gate with two NOT gates.

FIG. 5A is a logic diagram symbol and FIG. 5B is a schematic diagram of an S-R flip-flop.

FIG. 8 is a schematic diagram of the toggle flip-flop.

FIG. 9 is a block diagram of a toggle flip-flop using NOR gates.

DESCRIPTION OF THE INVENTION

Figure 5B:
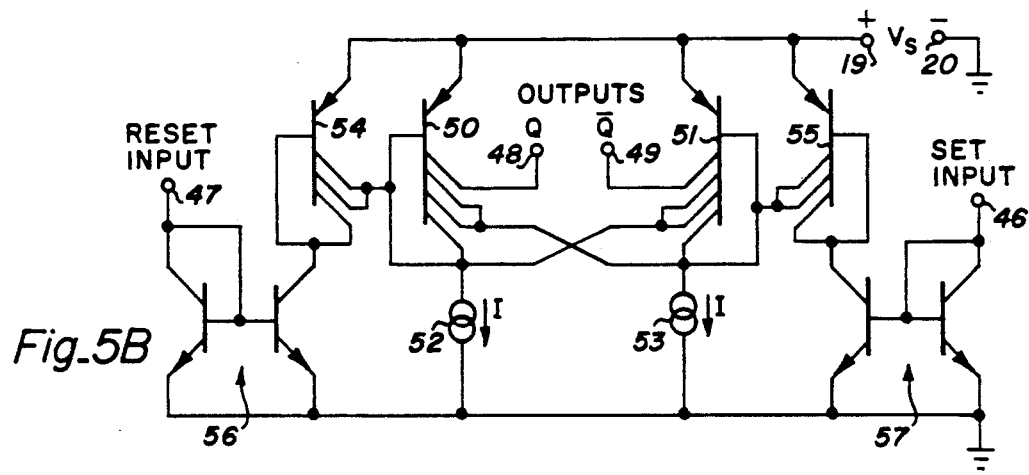

In the following discussions the circuits are all of the current mode logic design. Basically, such circuits have current outputs wherein a particular design current represents a logic one. A logic zero is indicated by a lack of current or some relatively low value of leakage current. These logic states are achieved with very low voltage swings, typically a fraction of a volt.

FIG. 1A shows the symbol of an inverter 10 circuit. In logic parlance it is a NOT gate. When operated as a current mode logic device, if current is sunk into terminal 11, in excess of a critical value or trip level, output terminal 12 sources zero current. Conversely, if the current input is zero, or less than the critical value, a current will flow out of terminal 12. FIG. 1B is a schematic diagram of such a NOT gate. The circuit operates from a $V_S$ power supply connected + to terminal 13 and—to ground terminal 14. Transistors 15 and 16 form an input current mirror which reflects the current applied to input terminal 11. Desirably, transistor 15 is twice the area of transistor 16 so that the mirror has a current gain of two. Current source 17 passes a current I which defines the critical current or the digital threshold level. By way of example, I is typically selected to be ⅛ microampere or 125nA.

Transistors 18 and 19 also form a current mirror which desirably has a unity current gain. The collector of transistor 18 is connected to the input of transistor 20 which is a PNP lateral device also connected to act as a current mirror. Since transistor 20 is a PNP device of lateral construction, its current gain will be unity if the two collectors collect equally. Thus, when the input current into terminal 11 is equal to I, transistor 15 will shunt the current flowing in source 17 to ground and no current will flow in transistors 19, 18 and 20. This means that there will be zero current at output terminal 12. If the current into transistor 16 goes to zero, all of the current in source 17 will flow into transistor 19 and, hence, transistor 18. This means that an equal current will flow out of terminal 12.

It will be noted that the current I flowing in source 17 defines the logic one output current. For the construction described, the circuit input current threshold is also equal to I/2. It is to be understood that other current levels can be chosen for the output logic one state and the input current trip level. This can be accommodated by selecting the current gains of the three current mirrors.

All of the transistors of FIG. 1B, and in subsequent figures, are of the kind commonly employed in linear monolithic silicon integrated circuits of the epitaxial PN junction isolated form of construction. Transistors 15, 16,18 and 19 are all NPN vertically oriented structures. Transistor 20 is a dual collector lateral PNP device. Desirably, each of the transistors is of minimum geometry for area conservation (except of transistor 15 which uses two minimum geometry emitters and is slightly larger than the other three NPN transistors). Much area is saved by placing transistors 15 and 19, into one collector tub. Transistors 18 and 20 may also share a tub.

Increasing the number of collectors on transistor 20 increases the gate fan-out with no additional tubs or area.

FIG. 2A is the block diagram symbol 22 for an OR logic circuit. In this device, when both inputs 23 and 24 are at logic zero (no current), the output at terminal 25 will also be at logic zero. If either input receives current (logic one) the output terminal 25 will be at logic one and source current. The schematic diagram of FIG. 2B performs this function. Inputs 23 and 24 are coupled respectively to current mirrors 26 and 27. These current mirrors are commonly coupled to PNP transistor 28 which is also connected as a current mirror. Thus, the output of transistor 28 is the sum of the currents out of current mirrors 26 and 27. This circuit has a drawback. The output logic one is a current having a value of 2I when both inputs are at a logic one I value and is at a value of I for a logic one at only one of the two inputs. Thus, the logic threshold varies with fan-in in a way analogous to standard CMOS ratioed logic.

FIG. 3A is the block diagram symbol of a NOR gate 29 in which a logic one at either input 30 or 31 will produce a logic zero at terminal 38. When both inputs are low the output will be high. FIG. 3B shows the circuitry. Here inputs 30 and 31 are coupled respectively to current mirrors 33 and 34, each of which have a current gain of two and their outputs are commonly coupled to unity gain current mirror 35. Current source 36, which passes the design current I, will provide the input to current mirror 35 only when both inputs are low. However, when a logic input current is applied to either mirror 33 or mirror 34, I will be shunted away from the input to current mirror 35. Thus, no current will flow into transistor 37 and the output at terminal 32 will be at logic zero. When the inputs at terminals 30 and 31 are both at logic zero, the current I will flow into current mirror 35. I will flow in transistor 37 and an output logic 1 will appear at terminal 32.

FIG. 4A is the symbol for a NAND logic gate 40. In this device when inputs 41 and 42 are both at logic zero, output terminal 43 will be high. Also, when both inputs 41 and 42 are high, terminal 43 will be low.

As shown in FIG. 4B, the NAND gate 40 can be created by driving the two inputs of an OR gate 22 by way of NOT gates 10. If complemented logic signals are already available, the NOT gates may be deleted.

FIG. 5A is a block diagram symbol 45 of an SR flip-flop. A logic 1 current into terminal 46 sets the flip-flop and a logic 1 current into terminal 47 resets the flip-flop. Terminals 48 and 49 are respectively the Q and $\overline{Q}$ outputs. FIG. 5B is the schematic diagram. Transistors 50 and 51, which are each four-collector lateral PNP transistors, are cross-coupled to produce a latching configuration. In this arrangement, only one of transistors 50 and 51 will be on at a time. Once a particular conduction state is realized it will remain until either the operating power is removed or the state is electrically switched. Constant current sources 52 and 53 are connected respectively between the bases of transistors 50 and 51 and ground. Thus, they each act to pull the respective bases down so as to attempt to turn transistors 50 and 51 on. Assuming, for example, that transistor 50 is on, the parallel collector pair will attempt to conduct 2I and will thus overcome source 53. This will pull the base of transistor 51 up so as to turn it off. This condition will persist as long as the circuit is powered and Q will be at logic high while $\overline{Q}$ will be at logic low.

This logic state will be complemented when transistor 51 is on and acts to turn transistor 50 off.

Transistors 54 and 55 are connected respectively to turn transistors 50 and 51 off and thus act as reset and set respectively for the latch, Current mirrors 56 and 57 each have unity gain and respectively couple terminals 47 and 46 to transistors 54 and 55. A logic one current into terminal 47 will turn transistor 54 on and its parallel collctor pair will pull the base of transistor 50 up so as to turn it off. In turn, source 53 will pull the base of transistor 51 down to turn it on. This resets the circuit.

Unity gain current mirror 57 acts through transistor 55 to pass a set current (logic one input) at terminal 46. In the set state, transistor 51 will be off and transistor 50 on.

In the above analysis, current mirrors 56 and 57
each have unity gain so that I will flow in each of the three collectors. If desired, the current mirrors 56 and 57 could be made to have current gain values of two. In this case, the dual parallel collectors of transistors 54 and 55 could be replaced with a single collector. In either design case, current sources 52 and 53 will be overpowered by the applied switching current.

Figure 6:
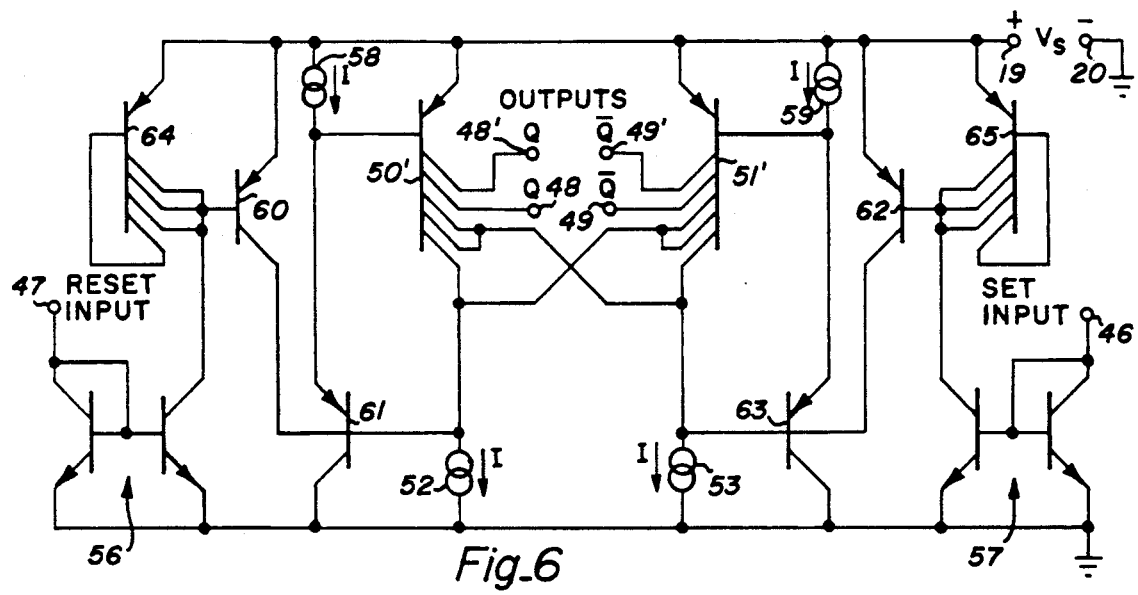
FIG. 6 is a schematic diagram of an S-R flip-flop with super diode transistor action and temperature compensated set and reset.

FIG. 6 shows an R-S flip-flop circuit that is functionally similar to the circuit of FIG. 5B. However, some improvements have been added. With the circuit of FIG. 5B, if transistors 50 and 51 have DC current gains that are too low, logic levels and functionality may fail. Transistors 61 and 63, in the super-diode configuration, force each collector of the transistor, 50' or 51', to conduct I. Current sources 58 and 59 are to bias transistors 61 and 63. Transistors 54 and 55 are replaced by 60 and 62, and use their full current gain to increase reset or set speed.

On the mirror image side of the circuit of FIG. 6, a similar action occurs between set terminal 46 and the base of transistor 51'. Thus, transistors 50' and 51' form a latch that is set from terminal 46 and reset from terminal 47 and the super diode action ensures reliable logic levels. As shown, transistors 50' and 51' each supply a pair of Q and $\overline{Q}$ outputs. The super diode action will provide the gain necessary for multiple outputs and several more such parallel outputs could be accommodated.

FIG. 6 shows an additional circuit improvement in the form of transistors 64 and 65 which are present for temperature compensation. Each of these transistors comprise a PNP lateral structure with four collectors, three of which are paralleled. Each, respectively, shunts the emitter base circuits of lateral PNP transistors 60 and 62. As is well known, the base of a PNP lateral transistor exists in the form of an isolation tub of n-expitaxial silicon. Such a tub will be PN junction isolated from the IC chip substrate and, due to the supply voltage, will be reverse biased. Therefore, a diode leakage current will flow out of the base of the transistor. At room temperature and below, this leakage current is so small it can be neglected. However, at higher temperatures the leakage current rises and, at about 100° C., becomes significant. Thus, three times the leakage in transistor 64 will shunt the emitter-base circuit of transistor 60. This will keep 60 and 62 off when reset or set inputs are at logic low.

Figure 7:
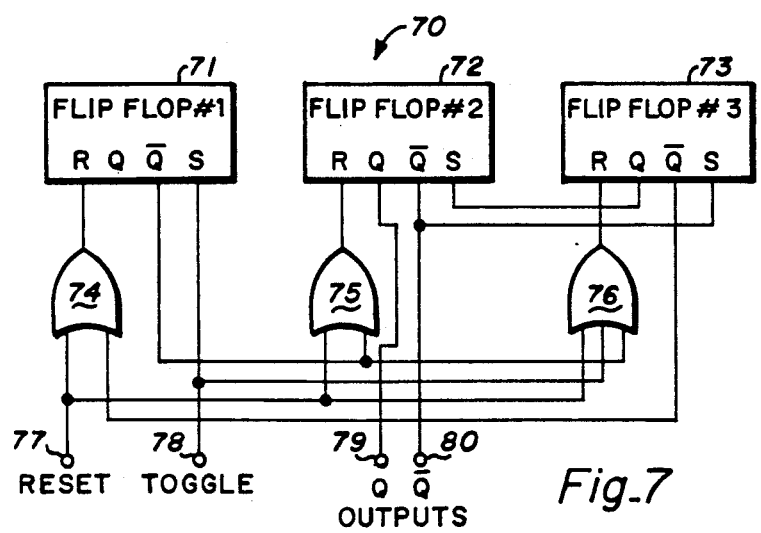
FIG. 7 is a block diagram of a toggle flip-flop.

FIG. 7 is a block diagram of a toggle flip-flop 70. Three R-S flip-flop circuits, 71–73, are cross-coupled and driven by OR gates 74–76. Reset terminal 77 is coupled to drive each of the flip-flops to its reset state. Toggle terminal 78 is directly coupled to the set terminal of flip-flop 71, the Q̄ output of which is also coupled to the reset terminals of flip-flops 72 and 73 by way of OR gates 75 and 76. The set terminal of flip-flop 72 is actuated by the Q output of flip-flop 73. The set terminal of flip-flop 73 is actuated by the Q̄ output of flip-flop 72. Thus, the three flip-flops are coupled together to respond as a unit to the set and reset inputs in the well-known manner of a toggle flip-flop digital element. The circuit output terminals 79 and 80 are the Q and Q̄ outputs taken from flip-flop 72. This circuit performs the conventional toggle flip-flop function of well known logic circuits.

FIG. 8 is a schematic diagram of a circuit having the configuration of block diagram 7. It is made up entirely of four collector PNP lateral transistors driven from NPN transistor current mirrors having current gains of two. It will be noted that flip-flop 72 has a Q output at terminal 79 which will supply 2I when high. The Q̄ output at terminal 80 will also be at 2I when high. It is clear that by adding more PNP transistors more outputs could be accommodated. It will also be noted that in each of the flip-flops idle transistor collectors are returned to ground so that all three flip-flops function the same. FIG. 9 is as a block diagram of an alternative form of toggle flip-flop. Where the functions are the same as those of FIGS. 7 and 8, the same numerals are employed. The circuit is composed of three two input OR gates, 85–87, two three input OR gates, 88–89, and one four input OR gate 90. Gates 85 and 88 form a first flip-flop, gates 86 and 89 form a second flip-flop and gates 87 and 90 form a third flip-flop. In the foregoing descriptions, it is to be understood that, while multiple collector lateral transistors are shown, each collector shown could comprise a single lateral transistor. Where two collectors are paralleled, a single double area device could be used. Furthermore, while four collector lateral PNP devices are preferred, more or fewer collectors could be employed. Also, while the steady state circuits are shown being overpowered by twice the value of control currents, a current ratio of other than two could be employed. The ratio needs only to exceed unity by a factor that will ensure reliable switching.

The invention has been described and several examples of current mode logic circuits shown. When a person skilled in the art reads the foregoing description, alternatives and equivalents, within the spirit and intent of the invention, will be apparent. Accordingly, it is intended that the scope of the invention be limited only by the claims that follow.

I claim:

1. A current mode logic circuit for use in conjunction with linear integrated circuits which employ silicon epitaxial monolithic PN junction isolated construction, operable from first and second power supply terminals, said circuit comprising:
    lateral PNP transistor means, connected to said first power supply terminal, to act as current source means that will provide said circuit output means;
    vertical NPN transistor means connected, into current mirror configurations, to said second power supply terminal to act as current sink means that will provide said circuit input means;
    means for coupling said PNP and said NPN transistor means together to perform a desired logic function; and
    means for applying controlled currents to said circuit to determine the current logic state levels.

2. The circuit of claim 1 wherein said logic is a NOT gate comprising:
    a plural collector PNP transistor having one collector returned to its base and another collector coupled to act as said circuit output node;
    a first NPN transistor current mirror having its output coupled to said base of said PNP transistor and having an input;
    a second NPN transistor current mirror having its output coupled to said input of said first current mirror and an input coupled to act as said circuit input terminal; and
    a current source coupled to said input of said first current mirror to supply a controlled current that defines said NOT gate threshold level and output current.

3. The circuit of claim 1 wherein said logic is an OR gate comprising:
    a plural collector PNP transistor having one collector returned to its base and another collector coupled to act as said circuit output node;
    a first NPN transistor current mirror having its output coupled to said base of said PNP transistor and its input coupled to act as a first circuit input; and
    a second NPN transistor current mirror having its output coupled to said PNP transistor base and its input coupled to act as a second circuit input.

4. The circuit of claim 1 wherein said logic is a NOR gate comprising:
    a plural collector PNP transistor having one collector returned to its base and another collector coupled to act as said circuit output node;
    a first NPN transistor current mirror having its output coupled to said base of said PNP transistor and having an input;
    a current source coupled to said input of said first current mirror to supply a controlled current that defines said NOR gate trip level and output current;
    a second NPN transistor current mirror having its output coupled to said input of said first current mirror and its input coupled to act as a first circuit input node; and
    a third NPN transistor current mirror having its output coupled to said input of said first current mirror and its input coupled to act as a second circuit input node.

5. The circuit of claim 1 wherein said logic is a set-reset flip-flop gate comprising:
    first and second plural collector PNP transistors, each one having a first collector returned to its base;
    first and second current sinks coupled to respectively sink a constant current out of said first collectors of said first and second plural collector PNP transistors, said constant current acting to determine the trip level and output current of said gate;
    additional collector means in said first and second plural collector PNP transistors cross-coupled to said bases to create a latching configuration whereby said first and second transistors operate in two stable operating states, a set state and a reset state;
    still further collector means in said first and second plural collector PNP transistors coupled to act as the Q and Q̄ output nodes of said circuit;
    a first NPN transistor current mirror having its input coupled to said circuit set terminal and its output coupled to drive said base of said first plural collector PNP transistor whereby a current pulse applied to said set terminal will set said circuit; and a second NPN transistor current mirror having its input coupled to said reset terminal and its output coupled to drive said base of said second plural collector PNP transistor whereby a current pulse applied to said reset terminal will reset said circuit.

6. The set-reset flip-flop logic gate of claim 5 wherein said first and second NPN transistor current mirrors are coupled to said bases of said first and second plural collector PNP transistor bases respectively by means of third and fourth plural collector PNP transistors connected to act as current mirrors.

7. The set-reset flip-flop logic gate of claim 5 wherein said first and second NPN transistor current mirrors are coupled to said bases of said first and second plural collector PNP transistor bases respectively by means of first and second PNP super diode transistor amplifiers.

8. The set-reset flip-flop logic gate of claim 6 further including a pair of leakage activated plural collector PNP transistors each of which has one collector returned to its base and another collector or collectors coupled to parallel the emitter-base circuit of said super diode transistor amplifiers whereby the circuit threshold operation is temperature compensated.

9. The set-reset flip-flop circuit of claim 5 further including means to create a toggle flip-flop having reset and toggle inputs and Q and $\overline{Q}$ outputs, said circuit comprising:

creating first, second and third set-reset flip-flop as set forth in claim 5;

a first two input OR gate means coupled to drive the reset input of said first set-reset flip-flop from the combined reset terminal input and the $\overline{Q}$ output of said third set-reset flip-flop;

a second two input OR gate means coupled to drive said reset input of said second set-reset flip-flop from the combined reset terminal and the Q output of said first set-reset a first three input OR gate means coupled to drive said reset input of said third set-reset flip-flop from the combined reset terminal, the $\overline{Q}$ output of said first set-reset flip-flop and said toggle input;

means for coupling said toggle input to said set terminal of said first set-reset flip-flop;

means for coupling said $\overline{Q}$ output of said second set-reset flip-flop to said set terminal of said third set-reset flip-flop;

means for coupling said Q output of said third set-reset flip-flop to said second set-reset flip-flop set input terminal; and means for providing said circuit Q and $\overline{Q}$ outputs from said second set-reset flip-flop.

* * * * *

REEXAMINATION CERTIFICATE (1796th)
United States Patent [19]
Wright

[11] B1 5,051,621
[45] Certificate Issued Sep. 15, 1992

[54] AREA-EFFICIENT LOW-POWER BIPOLAR CURRENT-MODE LOGIC

[75] Inventor: Michael E. Wright, Berkeley, Calif.

[73] Assignee: National Semiconductor Corporation

Reexamination Request:
No. 90/002,599, Feb. 11, 1992

Reexamination Certificate for:
Patent No.: 5,051,621
Issued: Sep. 24, 1991
Appl. No.: 519,385
Filed: May 4, 1990

[51] Int. Cl.[5] ............... H03K 19/086; H03K 19/082; H03K 19/013; H03K 19/003
[52] U.S. Cl. .................. 307/455; 307/299.3; 307/454; 307/475; 307/482.1
[58] Field of Search ............ 307/299.3, 455, 456, 307/350, 458

[56] References Cited
U.S. PATENT DOCUMENTS

| | | | |
|---|---|---|---|
| 4,071,774 | 1/1978 | Tokumaru et al. | 307/458 |
| 4,246,500 | 1/1981 | Okada et al. | 307/299.3 |
| 4,371,792 | 2/1983 | Dobkin | 307/299.3 |
| 4,672,576 | 6/1987 | Davis | 307/299.3 |
| 4,704,544 | 11/1987 | Horwitz | 307/270 |
| 4,736,125 | 4/1988 | Yuen | 307/475 |
| 4,737,663 | 4/1988 | Varadarajan | 307/455 |
| 4,945,263 | 7/1990 | Estrada | 307/475 |
| 4,945,265 | 7/1990 | Estrada | 307/455 |
| 4,988,898 | 1/1991 | Jansson | 307/475 |
| 4,988,899 | 1/1991 | Jansson | 307/475 |
| 5,013,934 | 5/1991 | Hobrecht et al. | 307/350 |

*Primary Examiner*—J. S. Heyman

[57] ABSTRACT

Current mode logic configuration circuits are shown for use with linear integrated circuit chips. The circuits employ plural collector lateral transistors to provide logic current source outputs in response to logic current inputs that are accepted by NPN transistor current mirrors acting as current sinks. Conventional logic functions are detailed and a toggle flip-flop configuration is shown being composed of the basic logic gates. Since the disclosed current mode voltage swings are small the circuit speed is relatively high at a given shunt capacitance. Die surface area is low with many transistors sharing common n-epitaxial tubs.

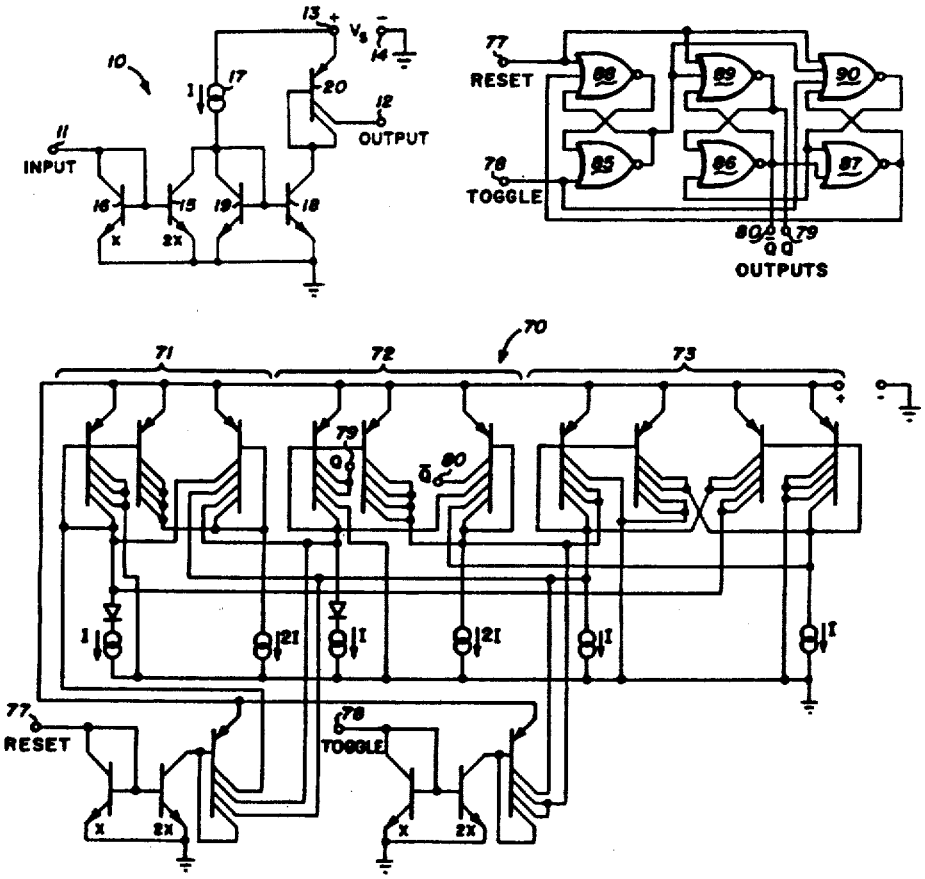

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

Claims 1,8 and 9 are determined to be patentable as amended.

Claims 2–7, dependent on an amended claim, are determined to be patentable.

1. A current mode logic circuit, *in which input current is manipulated to produce an output logic current,* for use in conjunction with linear integrated circuits which employ silicon epitaxial monolithic PN junction isolated construction, operable from first and second power supply terminals, said circuit comprising:

lateral PNP transistor means, *constructed to operate at the supply voltage levels employed in said linear integrated circuits, and* connected to said first power supply terminal, to act as current source means that will provide said circuit output [means] *logic;* vertical NPN transistor means, *constructed to operate at the supply voltage levels employed in said linear integrated circuits, and* connected, into current mirror configurations, to said second power supply terminal to act as current sink means that will [provide] *respond to* said circuit input [means] *current;* means for coupling said PNP and said NPN transistor means together to perform a desired logic function; and means for applying controlled currents to said circuit to [determine the] *represent said* current logic [state levels].

8. The set-reset flip-flop logic gate of claim [6] *7* further including a pair of leakage activated plural collector PNP transistors each of which has one collector returned to its base and another collector or collectors coupled to parallel the emitter-base circuit of said super diode transistor amplifiers whereby the circuit threshold operation is temperature compensated.

9. The set-reset flip-flop circuit of claim 5 further including means to create a toggle flip-flop having reset and toggle inputs and Q and $\bar{Q}$ outputs, said [circuit] *toggle flip-flop* comprising:

[creating] first, second and third set-reset [flip-flop] *flip-flops* as set forth in claim 5;

a first two input OR gate means coupled to drive the reset input of said first set-reset flip-flop from the combined reset terminal input and the $\bar{Q}$ output of said third set-reset flip-flop;

a second two input OR gate means coupled to drive said reset input of said second set-reset flip-flop from the combined reset terminal and the Q output of said first set-reset *flip-flop;* a first three input OR gate means coupled to drive said reset input of said third set-reset flip-flop from the combined reset terminal, the $\bar{Q}$ output of said first set-reset flip-flop and said toggle input;

means for coupling said toggle input to said set terminal of said first set-reset flip-flop;

means for coupling said $\bar{Q}$ output of said second set-reset flip-flop to said set terminal of said third set-reset flip-flop;

means for coupling said Q output of said third set-reset flip-flop to said second set-reset flip-flop set input terminal; and means for providing said circuit Q and $\bar{Q}$ outputs from said second set-reset flip-flop.

* * * * *